US011508646B2

(12) United States Patent
Miyawaki (10) Patent No.: US 11,508,646 B2
(45) Date of Patent: Nov. 22, 2022

(54) SEMICONDUCTOR DEVICE (71) Applicant: Mitsubishi Electric Corporation, Tokyo (JP)

(72) Inventor: Katsumi Miyawaki, Tokyo (JP)

(73) Assignee: Mitsubishi Electric Corporation, Tokyo (JP)

(*) Notice: Subject to any disclaimer, the term of this patent is extended or adjusted under 35 U.S.C. 154(b) by 213 days.

(21) Appl. No.: 16/963,677

(22) PCT Filed: Apr. 12, 2018

(86) PCT No.: PCT/JP2018/015385
§ 371 (c)(1),
(2) Date: Jul. 21, 2020

(87) PCT Pub. No.: WO2019/198199
PCT Pub. Date: Oct. 17, 2019

(65) Prior Publication Data
US 2021/0074612 A1    Mar. 11, 2021

(51) Int. Cl.
*H01L 23/495*    (2006.01)
*H01L 23/31*    (2006.01)
(Continued)

(52) U.S. Cl.
CPC .... *H01L 23/49531* (2013.01); *H01L 23/3107* (2013.01); *H01L 23/49503* (2013.01);
(Continued)

(58) Field of Classification Search
CPC ........... H01L 23/49531; H01L 23/3107; H01L 23/49503; H01L 23/49534
See application file for complete search history.

(56) References Cited

U.S. PATENT DOCUMENTS 6,621,162 B1    9/2003 Ishida et al.
2005/0012192 A1*  1/2005 Saso ............... H01L 23/552
257/E23.114
(Continued)

FOREIGN PATENT DOCUMENTS

JP    2001-085569 A    3/2001
JP    2003-078098 A    3/2003
(Continued)

OTHER PUBLICATIONS

International Search Report issued in PCT/JP2018/015385; dated Jun. 5, 2018.

*Primary Examiner* — Omar F Mojaddedi
(74) *Attorney, Agent, or Firm* — Studebaker & Brackett PC (57) ABSTRACT

A semiconductor device comprises; a lead frame having leads and a die pad; a printed circuit board including an electrode for the connection of each of the leads and the die pad, a wiring pattern, and an opening exposing a part of a surface of the die pad; the semiconductor element for processing a high frequency signal, mounted on a surface of a metal block bonded to the surface of the die pad exposed through the opening, and connected to the wiring pattern with a metal wire; electronic components connected to the wiring pattern and mounted on a surface of the printed circuit board; and a sealing resin to seal the printed circuit board, the semiconductor element, the electronic components, and the metal wire so as to expose rear surfaces of the leads and the die pad.

17 Claims, 8 Drawing Sheets

(51) Int. Cl.
 *H01L 23/66* (2006.01)
 *H01L 23/14* (2006.01)
 *H01L 23/13* (2006.01)
 *H05K 1/02* (2006.01)
 *H05K 3/28* (2006.01)

(52) U.S. Cl.
 CPC .. *H01L 23/49534* (2013.01); *H01L 23/49586* (2013.01); *H01L 23/66* (2013.01)

(56) References Cited

U.S. PATENT DOCUMENTS

| | | | |
|---|---|---|---|
| 2007/0164411 A1 | 7/2007 | Huang et al. | |
| 2011/0024899 A1* | 2/2011 | Masumoto | H01L 23/49816 257/E21.705 |
| 2011/0180919 A1* | 7/2011 | Jensen | H01L 25/0657 257/774 |
| 2013/0257565 A1 | 10/2013 | Masuda | |
| 2014/0070394 A1* | 3/2014 | Moriya | H01L 23/3735 257/690 |
| 2014/0252569 A1* | 9/2014 | Ikuma | H01L 23/552 257/659 |
| 2016/0090298 A1* | 3/2016 | Sengupta | B81B 7/0048 438/51 |
| 2016/0128181 A1 | 5/2016 | Yamada et al. | |
| 2017/0079128 A1* | 3/2017 | Wang | H01L 23/3677 |
| 2018/0090339 A1 | 3/2018 | Wang et al. | |

FOREIGN PATENT DOCUMENTS

| | | |
|---|---|---|
| JP | 2004-288662 A | 10/2004 |
| JP | 2013-207070 A | 10/2013 |
| JP | 2017-059812 A | 3/2017 |
| WO | 2015/163095 A1 | 10/2015 |

* cited by examiner

SEMICONDUCTOR DEVICE

TECHNICAL FIELD

The present application relates to a package structure of a semiconductor device.

BACKGROUND ART

As a wireless communication system represented by mobile phone base stations, a fifth generation mobile communication system (5G) is expected to be launched as a next-generation communication system in the near future. This communication system enables more simultaneous and larger capacity connections than in the past, and it is considered that antennas will be installed in many areas, especially in high-density population areas. Further, in a semiconductor device used for the mobile phone base stations, a semiconductor element that outputs power of 1 W (watt) or more needs to be installed. In order to achieve high frequency characteristics required for the semiconductor element that processes a high frequency signal of 1 GHz or more used in the mobile communication system, and the semiconductor device is required to maintain sufficient heat dissipation characteristics. In order to satisfy these requirements, a semiconductor device with a small size and low power consumption is necessary. In addition to the above, a low cost semiconductor device without an extreme increase in its cost compared with that in the fourth generation mobile communication system is required.

Currently, in a semiconductor device used for a wireless communication such as the mobile communication system, and in consideration of ease of use for customers, a module structure is adopted in which a high frequency circuit is formed on a printed circuit board, a chip of semiconductor element and electronic components (capacitors, inductors, resistors, etc.) are mounted on the circuit at the same time, and that a high frequency signal is matched on the printed circuit board.

In general, the printed circuit board used for a semiconductor device having the module structure uses an organic substrate as a base material made from glass epoxy resin or the like. However, since the above base material originally has very poor thermal conductivity, when high-power amplification using a semiconductor chip such as a gallium nitride (GaN) device or a gallium arsenide (GaAs) device is performed and if the heat generated from the chip cannot be efficiently dissipated, high frequency characteristics are degraded, so that a high output is difficult to be achieved. Further, as in Patent Document 1, for example, a ceramic material such as glass ceramic or alumina ceramic may be used for the printed circuit board.

CITATION LIST

Patent Document

Patent Document 1: Japanese Patent Application Laid-open No. 2013-207070 (FIG. 1)

SUMMARY OF INVENTION

Problems to be Solved by Invention

The stacked module described in Patent Document 1 includes a metal base on which a plurality of first semiconductor chips are mounted, a first multilayer substrate having a plurality of alumina substrates stacked and disposed on the surface of the metal base, a second multilayer substrate on which a plurality of second semiconductor chips are mounted, and a metal cavity and a metal lid that encapsulate a front side of the first multilayer substrate, the second multilayer substrate, the plurality of first semiconductor chips, and the plurality of second semiconductor chips. In the stacked module in Patent Document 1, since the plurality of first semiconductor chips are mounted on the metal base, the heat dissipation from the plurality of first semiconductor chips is maintained and the high frequency characteristics is satisfactory owing to the multilayer substrate of a ceramic material. However, the module has a large and complicated structure using the multilayer substrate of the ceramic material, and in addition the material is costly. Thus, it is hard to reduce the cost.

As a low-cost semiconductor device package, there is a resin-sealed package, and thus even for a semiconductor element that outputs power of 1 W or more, a semiconductor device sealed with resin is required. In the stacked module in Patent Document 1, a semiconductor element that outputs power of 1 W or more can be mounted, but it is not a low cost semiconductor device.

A technique disclosed in the present specification achieves a semiconductor device that can be resin-sealed while sufficient heat dissipation characteristics are maintained, even when a semiconductor element that output power of 1 W or more is mounted.

Means for Solving Problems

An example of a semiconductor device disclosed in the specification of the present application comprises: a lead frame having leads and a die pad; a printed circuit board including an electrode for a connection of each of the leads and the die pad, a wiring pattern, and an opening exposing a part of a surface of the die pad; a semiconductor element for processing a high frequency signal, mounted on the surface of the die pad exposed through the opening or mounted on a surface of a metal block bonded to the surface of the die pad exposed through the opening, and connected to the wiring pattern with a metal wire, the surface of the metal block being opposite to a surface facing the die pad; electronic components connected to the wiring pattern and mounted on a surface opposite to a surface of the printed circuit board facing the lead frame; and a sealing resin to seal the printed circuit board, the semiconductor element, the electronic components, and the metal wire so as to expose rear surfaces of the leads and the die pad opposite to surfaces facing the printed circuit board.

Effect of Invention

In an example of a semiconductor device disclosed in the specification of the present application, a semiconductor element is mounted on a surface of a die pad or a surface of a metal block exposed through an opening formed in a printed circuit board, and a sealing resin is included to seal the printed circuit board and the semiconductor element, so that sufficient heat dissipation characteristics can be maintained even when a semiconductor element that outputs power of 1 W or more is mounted and sealed with the resin.

MODES FOR CARRYING OUT INVENTION

Embodiment 1

Figure 1:
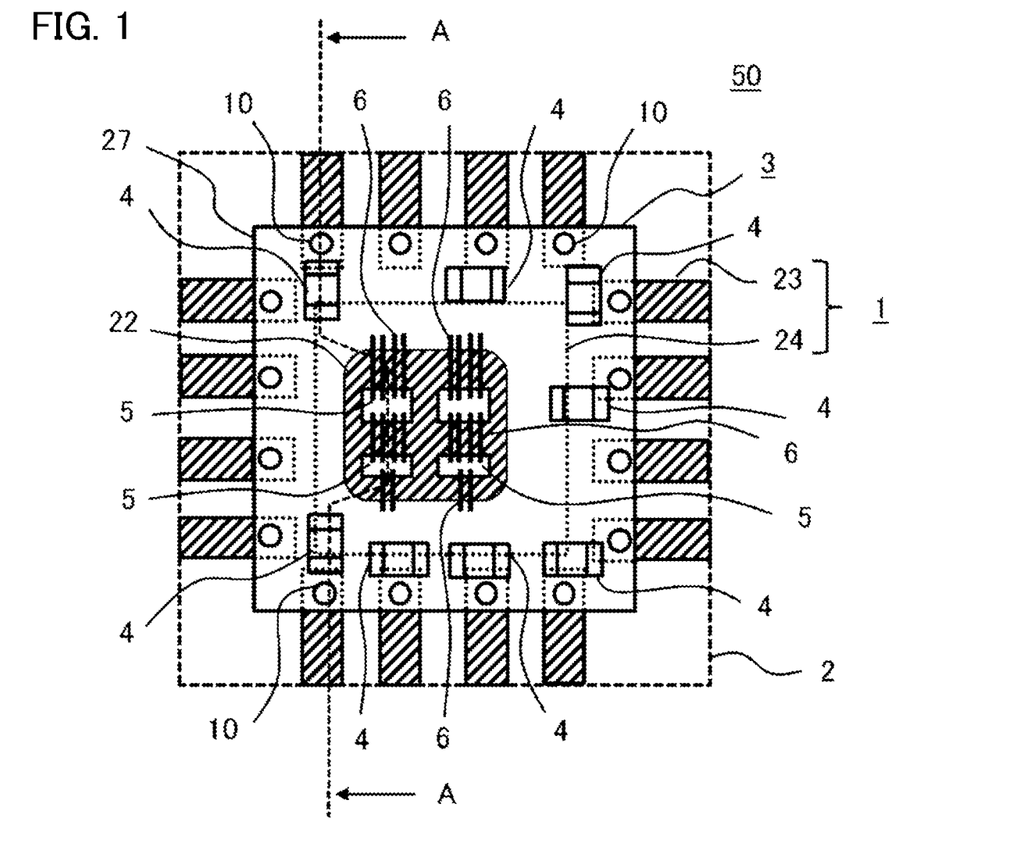
FIG. 1 is a diagram illustrating a semiconductor device according to Embodiment 1.
Figure 2:
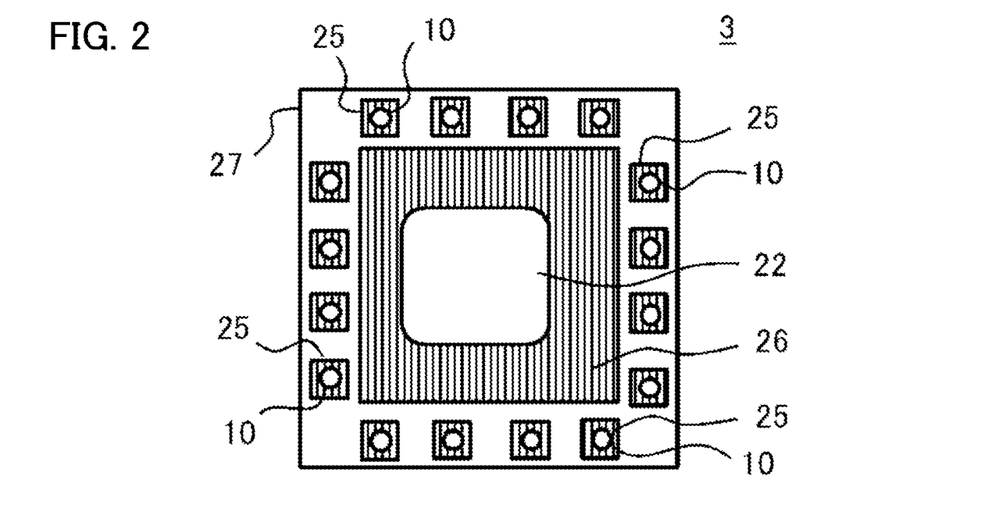
FIG. 2 is a diagram illustrating a rear surface of a printed circuit board of FIG. 1
Figure 3:
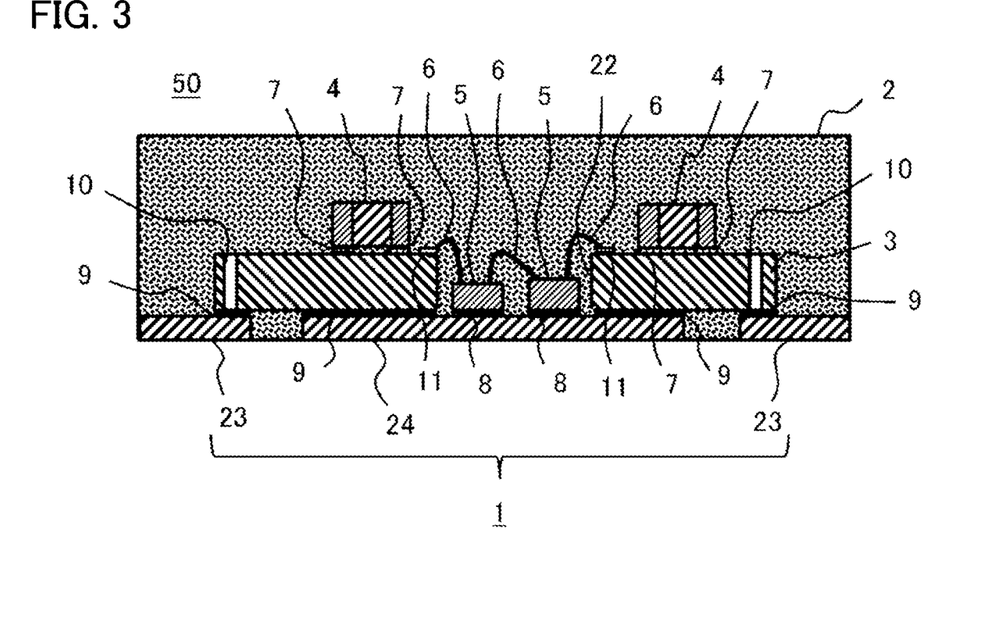
FIG. 3 is a schematic diagram of a cross section taken along line A-A in FIG. 1.
Figure 4:
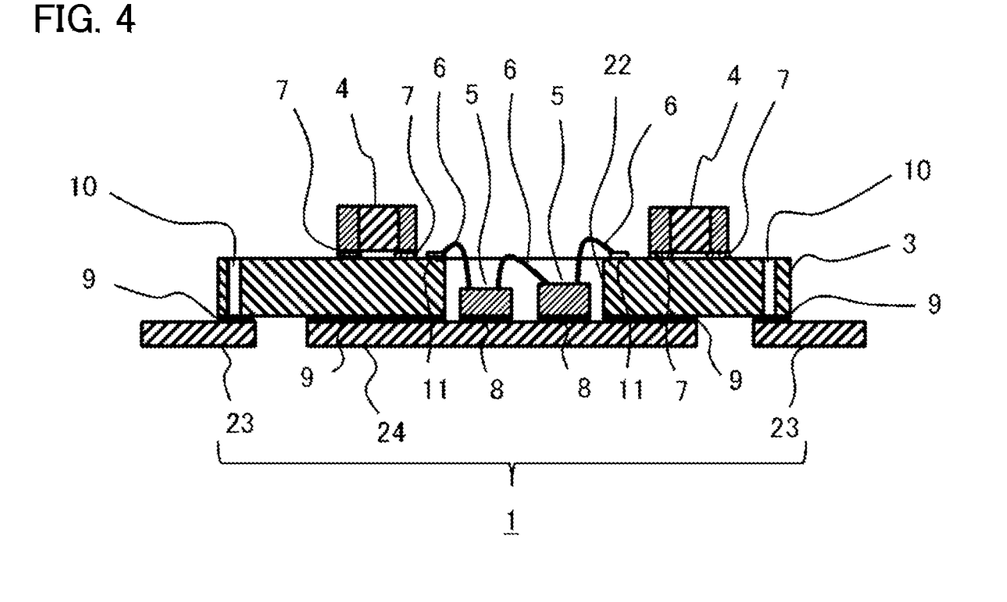
FIG. 4 is a schematic diagram in which an epoxy resin is omitted from FIG. 3.

FIG. 1 is a diagram illustrating a semiconductor device according to Embodiment 1. FIG. 2 is a diagram illustrating a rear surface of a printed circuit board of FIG. 1. FIG. 3 is a schematic diagram of a cross section taken along line A-A in FIG. 1, and FIG. 4 is a schematic diagram in which an epoxy resin is omitted from FIG. 3. A semiconductor device 50 of Embodiment 1 includes a lead frame 1, a printed circuit board 3, a semiconductor chip 5, electronic components 4, and an epoxy resin 2 as a sealing resin. The printed circuit board 3 is a general-purpose printed circuit board that is typically used. The printed circuit board 3 includes a resin base material 27 using a material based on a resin such as a flame retardant type 4 (FR-4) and a flame retardant type 5 (FR-5), and a high frequency circuit (not shown) formed by a wiring pattern 11 on the front or rear surface of the resin base material 27, and an opening 22 that comprises one or more through holes provided in a part of the printed circuit board 3. The lead frame 1 includes a die pad 24 on which the semiconductor chip 5 is mounted, and leads 23 as a plurality of terminals. The opening 22 of the printed circuit board 3 is formed to expose a part of the surface of the die pad 24. The semiconductor chip 5 is, for example, a chip of semiconductor element such as a GaN device or a GaAs device that processes a high frequency signal with a frequency of 1 GHz or more and outputs power of 1 W or more.

In FIG. 1, as an example, an inductor is formed by wiring (not shown) on the surface of the printed circuit board 3 (the surface opposite to the surface facing the lead frame 1), and the electronic components 4 that are capacitors or resistors are disposed. Thus the high frequency circuit is formed on the front surface but no high frequency circuit is formed on the rear surface of the printed circuit board 3 (the surface facing the lead frame 1). In FIG. 1, the epoxy resin 2 is shown by a broken line so that the internal structure can be seen and the figure cannot be complicated. As shown in FIG. 2, an electrode 26 for bonding the die pad 24 of the lead frame 1 and electrodes 25 for bonding the leads 23 of the lead frame 1 are provided on the rear surface of the printed circuit board 3. In FIGS. 1 and 2, the wiring pattern 11 (including a wiring forming the high frequency circuit) formed on the printed circuit board 3 is omitted. In FIGS. 3 and 4, the wiring pattern 11 formed on the printed circuit board 3 is omitted except for a portion connected to a metal wire 6. The semiconductor device 50 illustrated in FIG. 1 is an example in which the device is sealed as a quad flat no-lead (QFN) package. Four electrodes 25 are formed on each side of the rear surface of the printed circuit board 3, and each of the leads 23 is connected to each of the electrodes 25. Each of the electrodes 25 is connected to the wiring pattern 11 (not shown) on the surface of the printed circuit board 3 through vias 10.

The printed circuit board 3 is not limited to one having the high frequency circuit formed on the front surface or the rear surface. The printed circuit board 3 may be a multilayer printed circuit board (multilayer substrate) formed by repeatedly performing high frequency circuit processing using such a built-up method as laminating of a plurality of printed circuit boards on which high frequency circuits are formed, drilling, and filling of vias. In the printed circuit board 3 described above, via holes (vias 10) for electrically connecting the front surface and the rear surface or for electrically connecting the front surface, the rear surface, and inner layers of the multilayer substrate are formed. Even in the printed circuit board 3 with the multilayer structure, the electrodes 25 connected to the leads 23 of the lead frame 1 are formed at least on the outer periphery on the rear surface of the printed circuit board 3 as shown in FIG. 2. Each of the high frequency circuits of the printed circuit board 3 and the leads 23 are electrically connected through the electrodes 25 and the vias 10.

A method of assembling the semiconductor device 50 will be described. On the surface of the printed circuit board 3, a solder material 7 is formed at a required position by a solder printing method or the like. The electronic components 4 are placed on the solder material 7 using a mounter and fixed to the printed circuit board 3 by melting the solder material in a reflow process or the like (electronic component mounting process). Note that, if necessary, a cleaning by cleaning solution may be performed to remove the flux component contained in the solder material 7.

The printed circuit board 3 on which the electronic components 4 are mounted is bonded to the lead frame 1 (lead frame of QFN type) using a bonding material 9 such as a solder material or a conductive paste material (lead frame bonding process). Terminals of the high frequency circuit formed on the printed circuit board 3 are connected to the electrodes 25 on the rear surface of the printed circuit board 3 through the vias 10, and by connecting the electrodes 25 to the leads 23 being electrode terminals of the lead frame 1, the signal of the high frequency circuit can be output to the outside.

After bonding the printed circuit board 3 to the lead frame 1 to mount the printed circuit board, on the surface of the die pad 24 (the surface facing the printed circuit board 3) exposed through the opening 22, the semiconductor chip 5 is die-bonded with a so-called a die bonding material 8 such as a solder material or an Ag resin paste (semiconductor chip mounting process). Next, the high frequency circuit formed on the printed circuit board 3 is connected to the semiconductor chip 5 using the metal wire 6 such as a gold wire (wire bonding process). When a plurality of semiconductor chips 5 are mounted as shown in FIG. 1, the semiconductor chips 5 are connected to one another by the metal wires 6 as necessary. By the wire bonding process, the semiconductor chip 5 and the high frequency circuit are connected, and an electronic signal flows between the semiconductor chip 5 and the high frequency circuit. FIG. 4 shows the basic structure of the semiconductor device 50 on which the electronic component mounting process, the lead frame bonding process, the semiconductor chip mounting process, and the wire bonding process are performed.

The lead frame 1 to which the printed circuit board 3 is bonded, namely, the basic structure of the semiconductor device 50 is inserted into a transfer mold, and the lead frame 1, the printed circuit board 3, the electronic components 4, and the semiconductor chip 5 are sealed with the epoxy resin 2 that is melted (resin sealing process). After the resin sealing process, the semiconductor device 50 is manufactured in such a way that the leads 23 and the die pad 24 of the lead frame 1 are separated using a dicer or the like (separation process). When a single lead frame for performing the resin sealing process is formed so as to be able to seal a plurality of semiconductor devices 50, the semiconductor devices are divided into individual pieces using a dicer or the like.

The printed circuit board 3 used for the semiconductor device 50 of Embodiment 1 is the general-purpose printed circuit board in which a double-sided substrate on which a high frequency circuit is formed on the front or the rear surface, or a multilayer substrate laminated with printed circuit boards on which high frequency circuits are formed, and which has an opening 22 formed in a part thereof. The semiconductor device 50 of Embodiment 1 has a structure in which the printed circuit board 3 being a general-purpose printed circuit board, and a general-purpose lead frame 1 (for example, a lead frame of QFN type) used in a general-purpose plastic package in a semiconductor device are combined. In the semiconductor device 50 of Embodiment 1, a high frequency circuit for matching the high frequency signal is formed on the printed circuit board, so that high frequency matching can be performed within the printed circuit board 3. In addition, in the semiconductor device 50 of Embodiment 1, the semiconductor chip 5 is directly die-bonded on the surface of the die pad 24 of the lead frame 1 through the opening 22 formed in the printed circuit board 3. In other words, in the semiconductor device 50 of Embodiment 1, on the surface of the die pad 24 of the lead frame 1 exposed through the opening 22, the semiconductor chip 5 is directly die-boded. In the semiconductor device 50 of Embodiment 1, since the semiconductor chip 5 is directly die-bonded on the surface of the die pad 24 of the lead frame 1, the heat generated from the semiconductor chip 5 dissipates to the lead frame 1. Accordingly, in the semiconductor device 50 of Embodiment 1, the heat generated from the semiconductor chip 5 dissipates to the lead frame 1 without passing through the resin base material 27 of the printed circuit board 3 having poor thermal conductivity, so that the heat can be effectively discharged. Moreover, in the semiconductor device 50 of Embodiment 1, since the electrodes 25 on the rear surface of the printed circuit board 3 to which the front surface of the printed circuit board 3 or each layer of the multilayer substrate is connected through vias 10 is connected to the leads 23 of the lead frame 1, it is possible to easily output the high frequency matched electrical signal to the outside. That is, the semiconductor device 50 of Embodiment 1 can be easily mounted by means of the solder printing method and the reflow process of the solder material on a device substrate of a mobile communication system, etc. to which the semiconductor device is to be installed.

The semiconductor device 50 of Embodiment 1 can implement both of the function of matching the high frequency signal of 1 GHz or more that are used in a mobile communication system, etc., and processed by the semiconductor chip 5 and the function of dissipating the heat generated by the power of 1 W or more output by the semiconductor chip 5, by combining the general-purpose printed circuit board and the general-purpose lead frame. The semiconductor device 50 of Embodiment 1, unlike the stacked module of Patent Document 1 that has a large and complex structure, has a small and simple structure, and can be manufactured at low cost. Since the semiconductor device 50 of Embodiment 1 uses the general-purpose printed circuit board and the general-purpose lead frame, there is no particular restriction on the printed circuit board manufacturer and the lead frame manufacturer, and it is possible to manufacture the semiconductor device 50 by using components of any manufacturer, and cost reduction can be easily achieved. In addition, even when another semiconductor device is newly developed, the semiconductor device 50 of Embodiment 1 can be handled by redesigning only the printed circuit board 3 inside thereof if the terminal design of the semiconductor device does not change, and thus reduction of the development cost and shortening of the development period, etc. can be expected.

As described above, the semiconductor device 50 of Embodiment 1 comprises: the lead frame 1 having the leads 23 and the die pad 24; the printed circuit board 3 including the electrodes 25, 26 for the connection of each of the leads 23 and the die pad 24, the wiring pattern 11, and the opening 22 exposing a part of the surface of the die pad 24; the semiconductor element (semiconductor chip 5) for processing the high frequency signal, mounted on the surface of the die pad 24 exposed through the opening 22, and connected to the wiring pattern 11 with the metal wire 6; the electronic components 4 connected to the wiring pattern 11 and mounted on the surface of the printed circuit board 3 opposite to the surface thereof facing the lead frame 1; and the sealing resin (epoxy resin 2) for sealing the printed circuit board 3, the semiconductor element (semiconductor chip 5), the electronic components 4, and the metal wire 6 so as to expose the rear surfaces of the leads 23 and the die pad 24 that are opposite to the surfaces facing the printed circuit board 3. The semiconductor device 50 of Embodiment 1 has the configuration described above, so that sufficient heat dissipation characteristics can be maintained even when the semiconductor element (semiconductor chip 5) that outputs power of 1 W or more is mounted and sealed with the resin.

Embodiment 2

Figure 5:
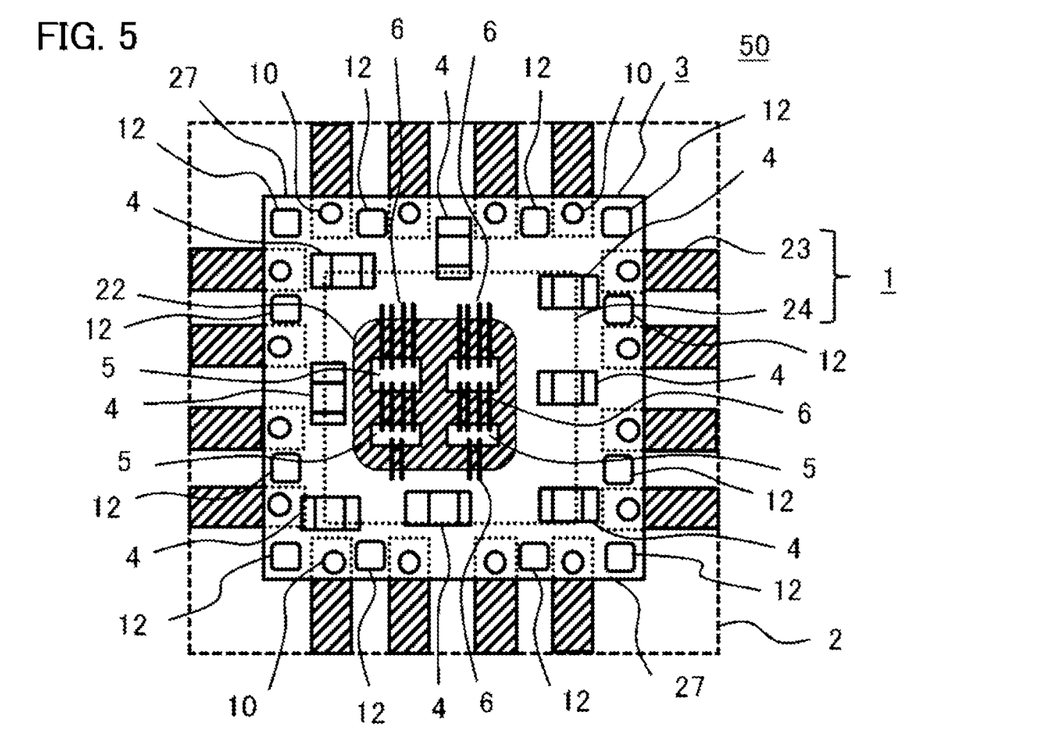
FIG. 5 is a diagram illustrating a semiconductor device according to Embodiment 2.
Figure 6:
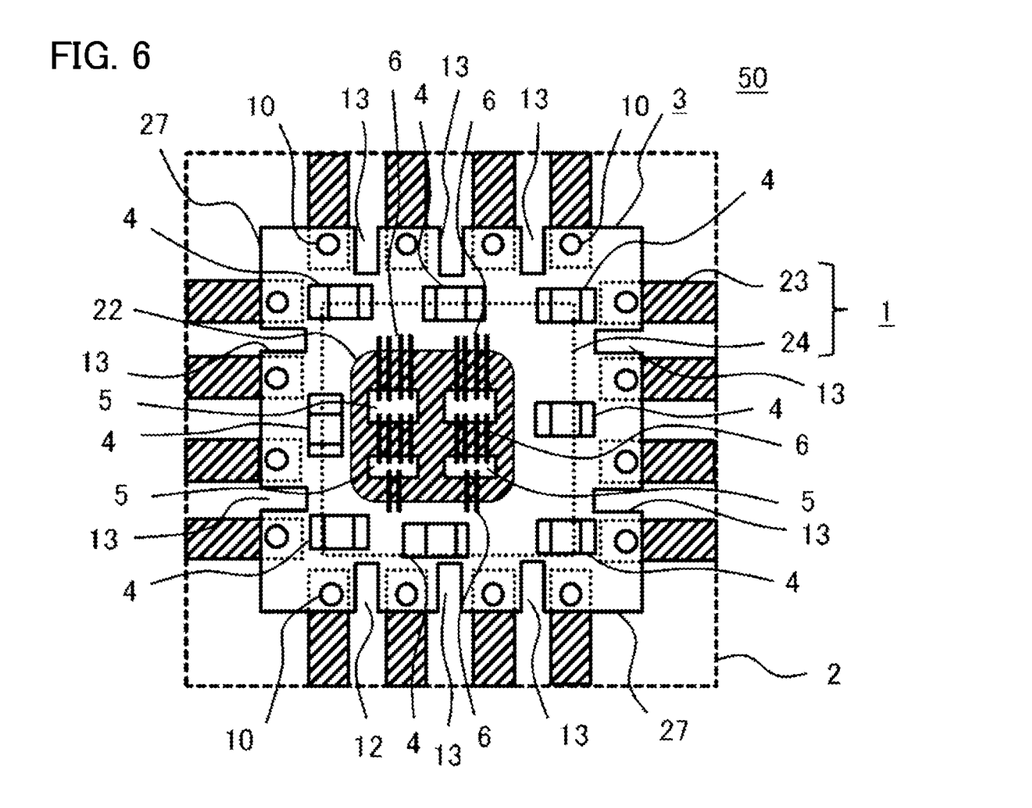
FIG. 6 is a diagram illustrating another semiconductor device according to Embodiment 2.

FIG. 5 is a diagram illustrating a semiconductor device according to Embodiment 2. A semiconductor device 50 of Embodiment 2 differs from the semiconductor device 50 of Embodiment 1 in that one or more through holes 12 are formed in an area where a high frequency circuit is not formed in an outer periphery of the resin base material 27 of the printed circuit board 3. Alternatively, as shown in FIG. 6, the semiconductor device may be a semiconductor device including a printed circuit board 3 having one or more concave portions 13 that are concave shaped notches formed on the outer periphery of the resin base material 27 of the printed circuit board 3. FIG. 6 is a diagram illustrating another semiconductor device according to Embodiment 2. In FIGS. 5 and 6, the same components as the semiconductor device 50 of Embodiment 1 are denoted by the same signs, and repetitive explanations are omitted. Note that in FIGS.

5 and 6, the wiring pattern 11 (including the wiring forming the high frequency circuit) formed on the printed circuit board 3 is omitted.

As described in Embodiment 1, regarding the semiconductor device that is resin-sealed, the sealing is performed by means of transfer molding using the epoxy resin 2 that is melted after bonding the printed circuit board 3 to the lead frame 1. At this time, regarding the melted epoxy resin 2, if there is an enclosed space (a space where the resin is difficult to flow at a portion such as a corner) in the structure to be sealed, depending on the manufacturing conditions, air may accumulate in that space, causing the epoxy resin 2 not to be filled and an internal void to be generated. In particular, in the case of a structure in which the printed circuit board 3 is mounted on the lead frame 1, an area between the rear surface of the printed circuit board 3 and the leads 23 of the lead frame 1 tends to have the enclosed space, and the internal void likely occurs in the area in the resin sealing process. Therefore, the printed circuit board 3 of Embodiment 2 shown in FIG. 5 is provided with the through holes 12 that go through the board in an area around the leads 23, that is, a part of the periphery of the electrodes 25 on the rear surface of the printed circuit board 3, in order to prevent the enclosed space from being formed in the periphery of the printed circuit board 3, that is, between the rear surface of the printed circuit board 3 and the leads 23 of the lead frame 1. Since the semiconductor device 50 of Embodiment 2 has the one or more through holes 12 in the printed circuit board 3, the air is efficiently released through the through holes 12 in the resin sealing process, so that a trapped air space is difficult to be generated and it is possible to completely fill the mold with the melted epoxy resin 2.

In addition, as shown in FIG. 6, when the concave portions 13 are formed in the outer periphery of the printed circuit board 3, the trapped air space is difficult to be generated as in the case where the through holes 12 in FIG. 5 is provided, and it is possible to completely fill the mold with the melted epoxy resin 2. Note that in FIG. 5, an example is shown in which at least one of the through holes 12 is disposed in close proximity to one of the leads 23. In FIG. 6, an example is shown in which at least one of the concave portions 13 is disposed in close proximity to one of the leads 23. In the case of two leads 23, it may be sufficient that only one through hole 12 or one concave portion 13 is provided in the printed circuit board 3.

Since the semiconductor device 50 of Embodiment 2 has the through hole 12 or the concave portion 13 in the outer periphery of the printed circuit board 3, the trapped air space is difficult to be generated during the transfer molding, namely, during the resin sealing process, and since the melted epoxy resin 2 can be completely filled into the mold, generation of the internal void in the epoxy resin 2 that is cured can be reduced, the yield can be high, and the quality can be improved. Furthermore, the semiconductor device 50 of Embodiment 2 can be reduced in cost by increasing the yield in the sealing.

Embodiment 3

Figure 7:
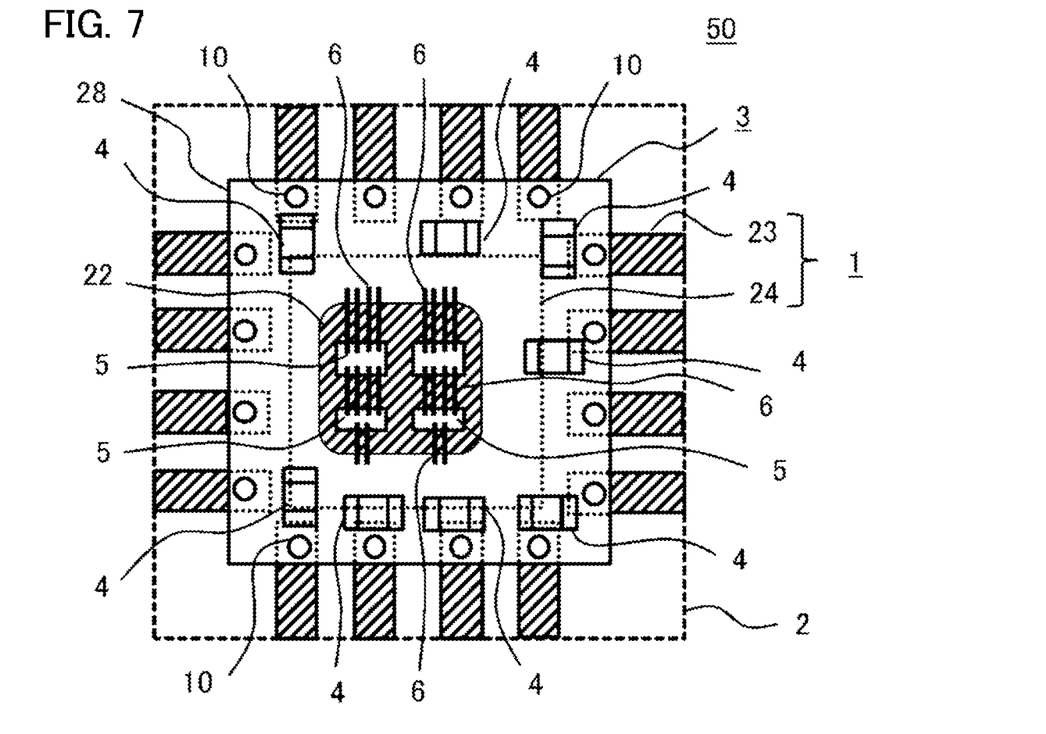
FIG. 7 is a diagram illustrating a semiconductor device according to Embodiment 3.

FIG. 7 is a diagram illustrating a semiconductor device according to Embodiment 3. The semiconductor device 50 of Embodiment 3 differs from the semiconductor device 50 of Embodiment 1 in that a base material of the printed circuit board 3 is a ceramic base material 28. For example, the ceramic base material 28 is an inorganic material such as an alumina material, a glass-ceramic material, and an aluminum nitride material, The other basic configuration is the same as the semiconductor device 50 of Embodiment 1. Note that, in the semiconductor device 50 of Embodiment 3, the through holes 12 or the concave portions 13 that are described in Embodiment 2 may be provided on the printed circuit board 3. Note that in FIG. 7, the wiring pattern 11 (including the wiring forming the high frequency circuit) formed on the printed circuit board 3 is omitted.

The resin base material 27, that is, the printed circuit board 3 of a resin substrate using an organic material is easy to be processed and low in cost. However, when a high frequency signal is considered in terms of transmission performance, the characteristics of the dielectric constant and the dielectric loss tangent of the resin base material 27 are poor, and thus the characteristics of the high frequency signal degrade if the frequency of the high frequency signal is increased. Especially, regarding the dielectric loss tangent, there is a problem that the characteristics of the high frequency signal degrade owing to its poor characteristics when the organic material is used. In contrast, the printed circuit board 3 using the ceramic base material 28, namely, the ceramic material has a smaller dielectric loss tangent value than that of the printed circuit board using the organic material, and it is possible to suppress the characteristic degradation of the high frequency signal. Especially when the transmission line is long, the dielectric loss tangent value significantly affects the high frequency signal, and thus a ceramic material is used for the printed circuit board to minimize the characteristic degradation of the high frequency signal.

Since the semiconductor device 50 of Embodiment 3 includes the printed circuit board 3 of the ceramic base material 28, it is possible to minimize the characteristic degradation of the high frequency signal.

Embodiment 4

Figure 8:
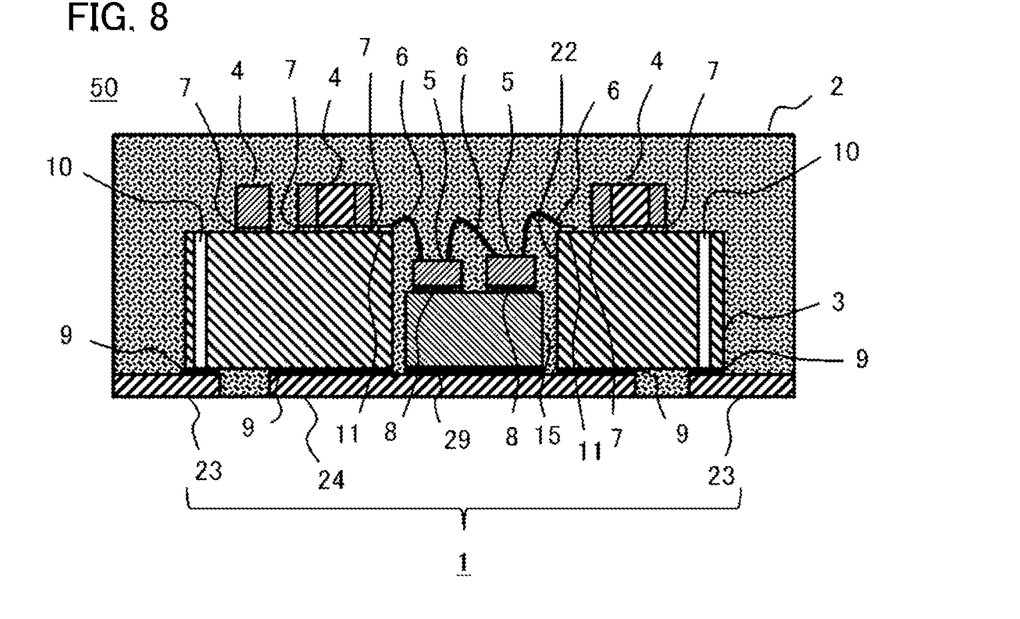
FIG. 8 is a schematic diagram illustrating a cross section of a semiconductor device according to Embodiment 4.
Figure 9:
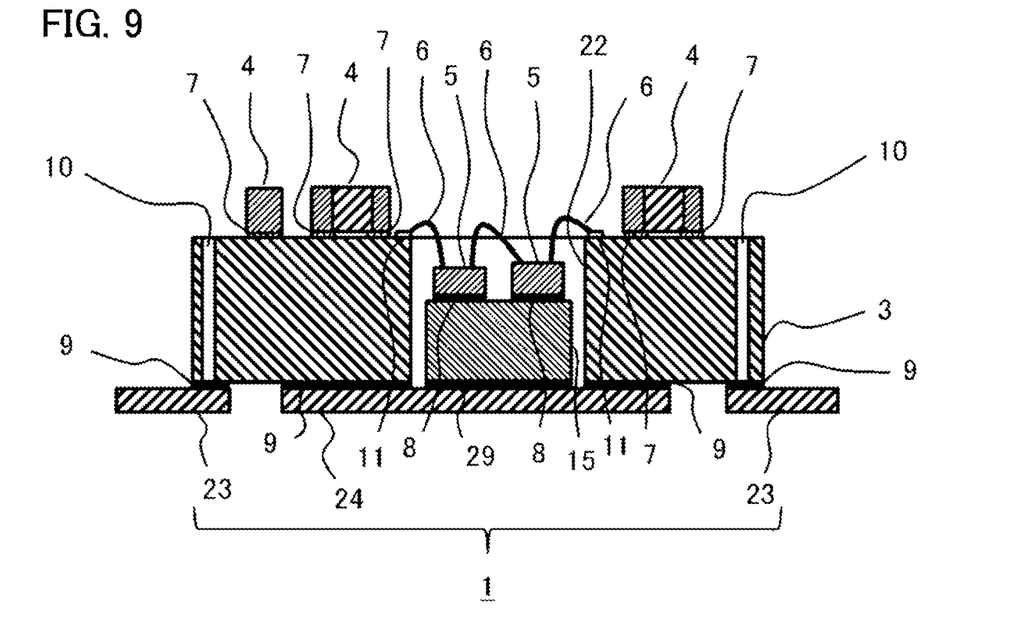
FIG. 9 is a schematic diagram in which an epoxy resin is omitted from FIG. 8.

FIG. 8 is a schematic diagram illustrating a cross section of a semiconductor device according to Embodiment 4. FIG. 9 is a schematic diagram in which an epoxy resin is omitted from FIG. 8. The semiconductor device 50 of Embodiment 4 differs from the semiconductor device 50 of Embodiment 1 in that a metal block 15 with good heat dissipation characteristics is interposed between the die pad 24 of the lead frame 1 and the semiconductor chip 5. In the semiconductor device 50 of Embodiment 4, the metal block 15 with good heat dissipation characteristics, such as a Cu/Mo alloy, is mounted on the surface of the die pad 24 of the lead frame 1 that is exposed through the opening 22 of the printed circuit board 3, by using a bonding material 29 such as a solder material, an Ag paste (a conductive paste material), etc. The semiconductor device 50 of Embodiment 4 has the semiconductor chip 5 die-bonded on the surface of the metal block 15 with the die-bonding material 8, and the semiconductor chip 5 and the wiring pattern (not shown) formed on the surface of the printed circuit board 3 are connected with the metal wire 6. The other basic configuration is the same as the semiconductor device 50 of Embodiment 1. Note that, in the semiconductor device 50 of Embodiment 4, the through holes 12 or the concave portions 13 that are described in Embodiment 2 may be provided on the printed circuit board 3. In the semiconductor device 50 of Embodiment 4, the base material of the printed circuit board 3 may be replaced with the ceramic base material 28. Note that, in FIGS. 8 and 9, the wiring pattern 11 formed on the printed circuit board 3 is omitted except for a portion connected to the metal wire 6.

In some cases, a thick printed circuit board 3 is used for the semiconductor device. In particular, when a printed circuit board 3 with multilayer substrates is used, the printed circuit board 3 is thicker. The semiconductor chip 5 is die-bonded on the surface of the die pad 24 of the lead frame 1 exposed through the opening 22 of the printed circuit board 3, and thus, in the case of the thick printed circuit board 3, the height difference (the difference in height) between the surface of the semiconductor chip 5 (the surface opposite to the surface facing the lead frame 1) and the surface of the printed circuit board 3 is large. Accordingly, when these surfaces are connected by the metal wire 6 or the like, the length of the metal wire 6 is longer, and a problem arises in that the electrical characteristics, especially the characteristics of the high frequency signal, degrade. Therefore, in the semiconductor device 50 of Embodiment 4, the metal block 15 with good heat dissipation characteristics is disposed and mounted on the surface of the die pad 24 of the lead frame 1 exposed from the opening 22 of the printed circuit board 3, so that the surface on which the semiconductor chip 5 is mounted can be higher in position than the die pad 24 of the lead frame 1. In the semiconductor device 50 of Embodiment 4, the height difference between the surface of the printed circuit board 3, namely, the surface on which the metal wire 6 is connected and the surface of the semiconductor chip 5 can be reduced, and the wire length of the metal wire 6 can be shortened when the connection is made.

In the semiconductor device 50 of Embodiment 4, the height difference between the surface of the semiconductor chip 5 and the surface of the printed circuit board 3 is small, and when these surfaces are connected by the metal wire 6, the wire length of the metal wire 6 can be shortened, and the characteristic degradation of the high frequency signal can be minimized. For example, the difference in height (the height difference) between the surface of the metal block 15 on which the semiconductor element (semiconductor chip 5) is mounted and the metal wire connection surface in the printed circuit board 3 to which the metal wire 6 connected to the semiconductor element (semiconductor chip 5) is connected is preferably ½ or less of the height of the printed circuit board 3.

As described above, the semiconductor device 50 of Embodiment 4 comprises: the lead frame 1 including the leads 23 and the die pad 24; the printed circuit board 3 having the electrodes 25,26 for the connection of each of the leads 23 and the die pad 24, the wiring pattern 11, and the opening 22 exposing a part of the surface of the die pad 24; the semiconductor element (semiconductor chip 5) for processing a high frequency signal, mounted on the surface of the metal block 15 bonded to the surface of the die pad 24 exposed through the opening 22, and connected to the wiring pattern 11 with the metal wire 6, the surface of the metal block being opposite to the surface facing the die pad 24; the electronic components 4 connected to the wiring pattern 11 and mounted on the surface of the printed circuit board 3 opposite to the surface thereof facing the lead frame 1; and the sealing resin (epoxy resin 2) for sealing the printed circuit board 3, the semiconductor element (semiconductor chip 5), the electronic components 4, and the metal wire 6 so as to expose the rear surfaces of the leads 23 and the die pad 24 opposite to the surfaces facing the printed circuit board 3. The semiconductor device 50 of Embodiment 4 has the configuration described above, so that sufficient heat dissipation characteristics can be maintained even when a semiconductor element (semiconductor chip 5) that outputs power of 1 W or more is mounted and sealed with the resin.

Embodiment 5

Figure 10:
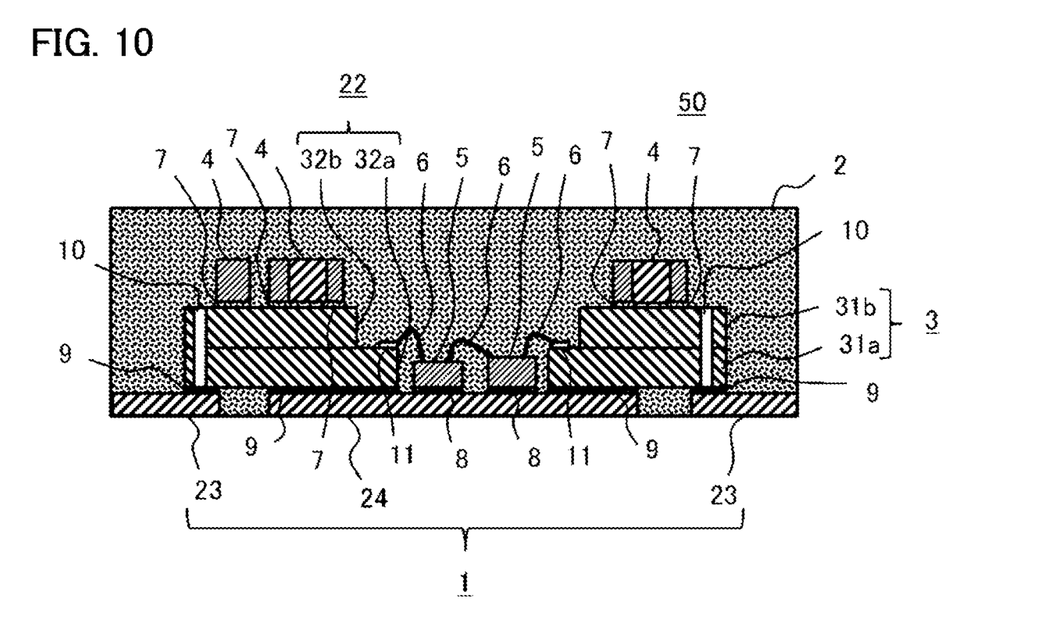
FIG. 10 is a schematic diagram illustrating a cross section of a semiconductor device according to Embodiment 5.
Figure 11:
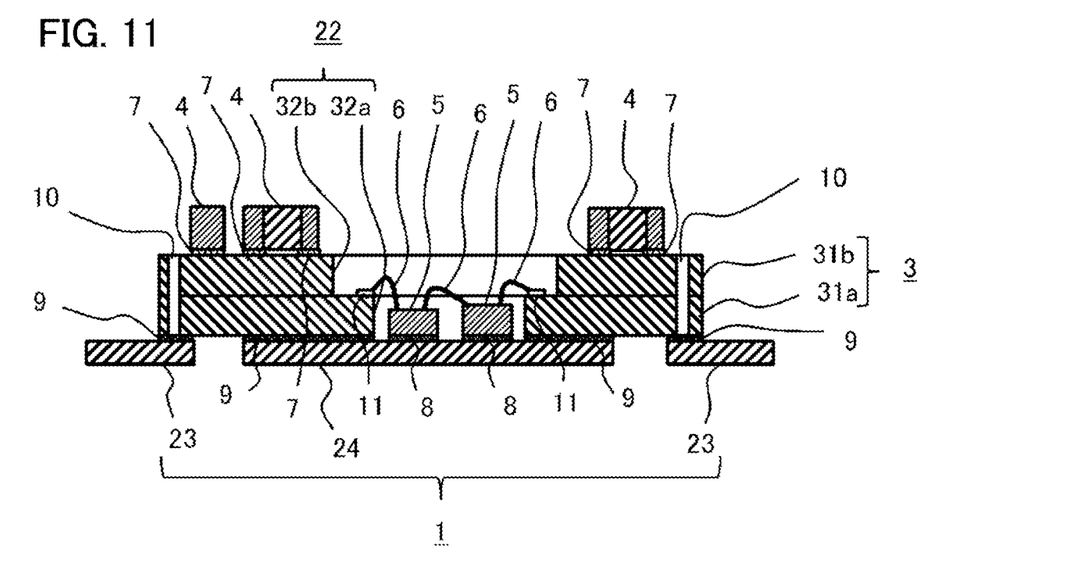
FIG. 11 is a schematic diagram in which an epoxy resin is omitted from FIG. 10.

FIG. 10 is a schematic diagram illustrating a cross section of a semiconductor device according to Embodiment 5. FIG. 11 is a schematic diagram in which an epoxy resin is omitted from FIG. 10. The semiconductor device 50 of Embodiment 5 differs from the semiconductor device 50 of Embodiment 1 in that the printed circuit board 3 is a multilayer substrate having a plurality of substrates (basic substrate) of different opening areas, and the wiring pattern on an inner layer exposed through the opening 22 formed in a staircase shape is connected to the semiconductor chip 5 by the metal wire 6. In FIGS. 10 and 11, an example of the multilayer substrate is shown in which the printed circuit board 3 is stacked with a first substrate 31a serving as a basic substrate that has a first opening 32a, and a second substrate 31b serving as a basic substrate that has a second opening 32b and has a wider opening area than the first opening 32a. The semiconductor chip 5 is connected by the metal wire 6 to the wiring pattern on the first substrate 31a exposed through the opening 22 formed in the staircase shape. The other basic configuration is the same as the semiconductor device 50 of Embodiment 1. Note that, in the semiconductor device 50 of Embodiment 5, the through holes 12 or the concave portions 13 that are described in Embodiment 2 may be provided on the printed circuit board 3. In the semiconductor device 50 of Embodiment 5, the base material of the printed circuit board 3 may be replaced with the ceramic base material 28. In FIGS. 10 and 11, the first substrate 31a is a lowermost basic substrate that is the basic substrate on the side close to the mounting surface on which the semiconductor element (semiconductor chip 5) is mounted, and the second substrate 31b is an uppermost basic substrate that is the basic substrate farthest away from the semiconductor element (semiconductor chip 5). Note that, in FIGS. 10 and 11, the wiring pattern 11 formed on the printed circuit board 3 is omitted except for a portion connected to the metal wire 6.

In some cases, the printed circuit board 3 of the multilayer substrate is used for a semiconductor device. When the multilayer substrate in which substrates are stacked is used, the height difference between the surface of the printed circuit board 3 and the surface of the semiconductor chip 5 is large, as with the thick printed circuit board 3 of Embodiment 4. Accordingly, when these surfaces are connected by the metal wire 6 or the like, the length of the metal wire 6 is longer, and a problem arises in that the electrical characteristics, especially the characteristics of the high frequency signal, degrade. Therefore, in the semiconductor device 50 of Embodiment 5, since the opening 22 provided in the multilayer substrate is formed to be in the staircase shape, it is possible to reduce the height difference between the surface of the semiconductor chip 5 and the first substrate 31a of the lower layer exposed through the opening 22 formed in the staircase shape, and to shorten the wire length of the metal wire 6 when the wiring pattern of the first substrate 31a is connected to the semiconductor chip 5 with the metal wire 6. The printed circuit board 3 having the opening 22 in the staircase shape can be manufactured by preparing substrates with openings in different diameters, namely, different opening areas and stacking them by arranging a substrate with an opening in a smaller diameter, namely, a smaller opening area as a lower layer and a substrate with an opening in a larger opening diameter as an upper layer.

In the semiconductor device 50 of Embodiment 5, the height difference between the surface of the lower layer substrate (first substrate 31a) exposed through the opening 22 formed in the staircase shape in the printed circuit board 3 and the surface of the semiconductor chip 5 is small, and when these surfaces are connected by the metal wire 6, the wire length of the metal wire 6 can be shortened, and the characteristic degradation of the high frequency signal can be minimized.

Embodiment 6

Figure 12:
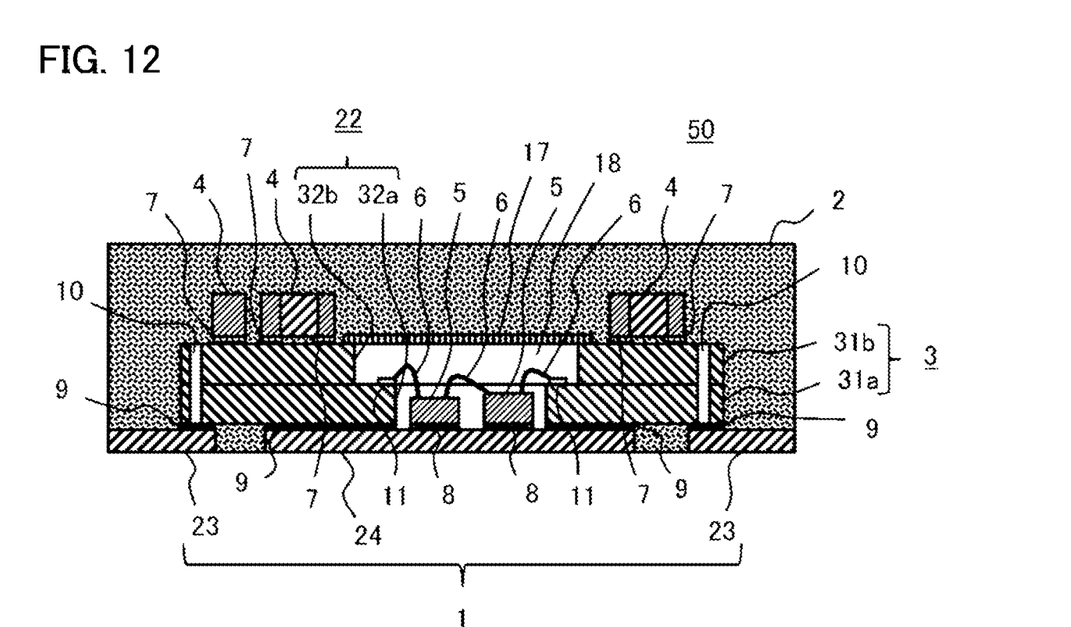
FIG. 12 is a schematic diagram illustrating a cross section of a semiconductor device according to Embodiment 6.
Figure 13:
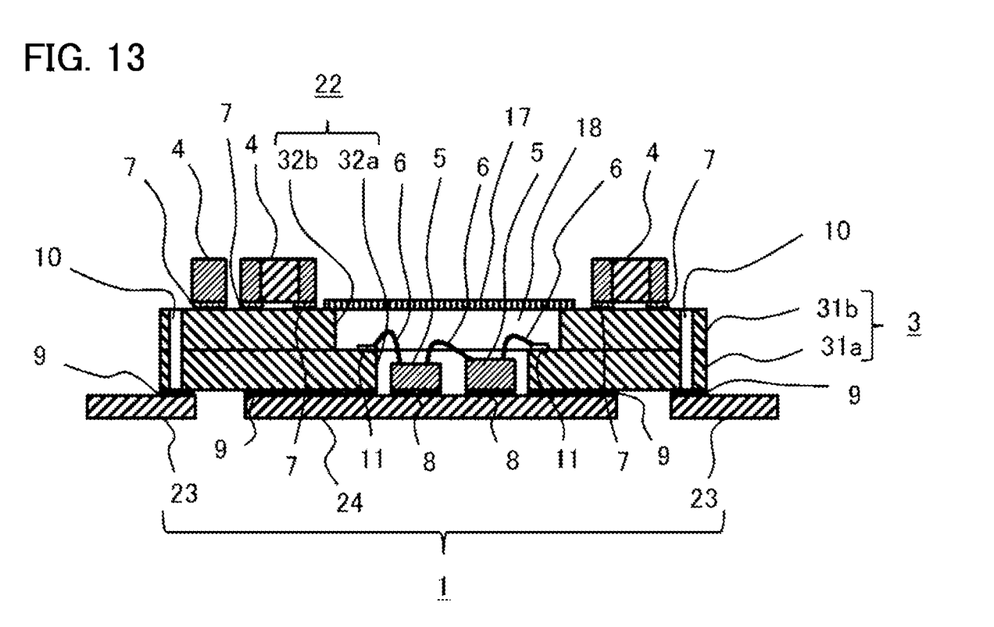
FIG. 13 is a schematic diagram in which an epoxy resin is omitted from FIG. 12.

FIG. 12 is a schematic diagram illustrating a cross section of a semiconductor device according to Embodiment 6. FIG. 13 is a schematic diagram in which an epoxy resin is omitted from FIG. 12. The semiconductor device 50 of Embodiment 6 differs from the semiconductor device 50 of Embodiment 5 in that the opening 22 is covered by a lid 17 to make a hollow part 18 around the semiconductor chip 5. The other basic configuration is the same as the semiconductor device 50 of Embodiment 5. The semiconductor device 50 of Embodiment 6 uses a multilayer substrate having the opening 22 formed in a staircase shape as described in embodiment 5 in which the semiconductor chip 5 is die-bonded on the surface of the die pad 24 of the lead frame 1. Thereafter, in the semiconductor device 50 of Embodiment 6, the wiring pattern on the lower layer substrate (first substrate 31a) exposed through the opening 22 formed in a staircase shape is connected to the semiconductor chip 5 with the metal wire 6 (wire-bonding connection), and then the front side of the opening 22 (the opposite side to the side of the lead frame 1) is covered with a lid 17 of a metal or a resin, etc., so that the surrounding area of the semiconductor chip 5 is formed to be a hollow structure as the hollow part 18. Thereafter, the semiconductor device 50 of Embodiment 6 is sealed entirely with the epoxy resin 2 used for the transfer molding. Note that, in the semiconductor device 50 of Embodiment 6, the through holes 12 or the concave portions 13 that are described in Embodiment 2 may be provided on the printed circuit board 3. In the semiconductor device 50 of Embodiment 6, the base material of the printed circuit board 3 may be replaced with the ceramic base material 28. Note that, in FIGS. 12 and 13, the wiring pattern 11 formed on the printed circuit board 3 is omitted except for a portion connected to the metal wire 6.

In the semiconductor chip 5 used in a high frequency device, the characteristics of the high frequency signal degrade when the wire length of the metal wire 6 is longer. Furthermore, it has been found that the characteristics of the high frequency signal are degraded even if a dielectric material with a high dielectric constant, etc., comes into contact with the surface of a transistor, which is an example of a semiconductor chip 5. For example, a typical plastic molded package has a structure in which the semiconductor chip 5 is surrounded by the epoxy resin with the dielectric constant Er of 3.9, and thus the high frequency characteristics generally tend to degrade. As a countermeasure, a package with a hollow structure is often used in a semiconductor device installed with a high frequency device. This is because the hollow structure allows the surrounding of the semiconductor chip 5 to be air with a dielectric constant Er of 1.

Therefore, the semiconductor device 50 of Embodiment 6 uses the printed circuit board 3 which is the multilayer substrate having the opening 22 formed in the staircase shape described in embodiment 5. In the printed circuit board 3, the semiconductor chip 5 is die-bonded on the surface of the die pad 24 of the lead frame 1, and after the semiconductor chip 5 and the printed circuit board 3 are wire-bonded with the metal wire 6, the lid 17 in a shape larger than the opening diameter, namely, the opening area is placed to cover the opening 22 and is fixed with a bonding material. The material of the lid 17 can be any of a metal, a resin, a ceramic material, etc. After the above process, in the semiconductor device 50 of Embodiment 6, the printed circuit board 3 of the multilayer substrate is sealed entirely with the epoxy resin 2 by means of the transfer molding. Even though the semiconductor device 50 of Embodiment 6 is filled with the epoxy resin 2, it is possible to make the surrounding of the semiconductor chip 5 be the hollow structure.

The semiconductor device 50 of Embodiment 6 is the structure sealed with the epoxy resin 2, but the surrounding of the semiconductor chip 5 is the hollow structure, and it is possible to maintain the dielectric constant of air, namely, the dielectric constant Er of 1 around the surrounding of the semiconductor chip 5, thereby minimizing the characteristic degradation of the high frequency signal.

Note that, the semiconductor device 50 of Embodiment 1 to Embodiment 6 may be equipped with a semiconductor element that outputs a power less than 1 W. Even if the semiconductor device equipped with the semiconductor element that outputs a power less than 1 W is resin-sealed, the high heat dissipation performance can be maintained. Furthermore, although various exemplary embodiments and examples are described in the present application, various features, aspects, and functions described in one or more embodiments are not inherent in a particular embodiment, and can be applicable alone or in their various combinations to each embodiment. Accordingly, countless variations that are not illustrated are envisaged within the scope of the art disclosed herein. For example, the case where at least one component is modified, added or omitted, and the case where at least one component is extracted and combined with a component in another embodiment are included.

DESCRIPTION OF REFERENCE NUMERALS AND SIGNS

1: lead frame, 2: epoxy resin (sealing resin), 3: printed circuit board, 4: electronic component, 5: semiconductor chip, 6: metal wire, 11: wiring pattern, 12: through hole, 13: concave portion, 15: metal block, 17 lid, 18: hollow part, 22: opening, 23: lead, 24: die pad, 25: electrode, 26: electrode, 27: resin base material, 28: ceramic base material, 31a: first substrate (basic substrate), 31b: second substrate (basic substrate), 32a: first opening, 32b: second opening, 50: semiconductor device

The invention claimed is:
1. A semiconductor device equipped with a semiconductor element for processing a high frequency signal, comprising:
   a lead frame having leads and a die pad;
   a printed circuit board including an electrode for a connection of each of the leads and the die pad, a wiring pattern, and an opening exposing a part of a surface of the die pad;
   the semiconductor element mounted on the surface of the die pad exposed through the opening or mounted on a surface of a metal block bonded to the surface of the die pad exposed through the opening, and connected to the wiring pattern with a metal wire, the surface of the metal block being opposite to a surface facing the die pad;

electronic components connected to the wiring pattern and mounted on a surface of the printed circuit board opposite to a surface thereof facing the lead frame; and a sealing resin to seal the printed circuit board, the semiconductor element, the electronic components, and the metal wire so as to expose rear surfaces of the leads and the die pad opposite to surfaces facing the printed circuit board, wherein the printed circuit board has through holes provided around the leads on an outer periphery thereof in which the wiring pattern is not formed so as to allow air, if present in the sealing resin, to be released through the through holes.

2. A semiconductor device equipped with a semiconductor element for processing a high frequency signal, comprising:

a lead frame having leads and a die pad;

a printed circuit board including an electrode for a connection of each of the leads and the die pad, a wiring pattern, and an opening exposing a part of a surface of the die pad;

the semiconductor element mounted on the surface of the die pad exposed through the opening or mounted on a surface of a metal block bonded to the surface of the die pad exposed through the opening, and connected to the wiring pattern with a metal wire, the surface of the metal block being opposite to a surface facing the die pad;

electronic components connected to the wiring pattern and mounted on a surface of the printed circuit board opposite to a surface thereof facing the lead frame; and a sealing resin to seal the printed circuit board, the semiconductor element, the electronic components, and the metal wire so as to expose rear surfaces of the leads and the die pad opposite to surfaces facing the printed circuit board, wherein the printed circuit board has concave portions provided around the leads on an outer periphery thereof in which the wiring pattern is not formed so as to allow air, if present in the sealing resin, to be released through the concave portions.

3. The semiconductor device according to claim 1, wherein the semiconductor element is mounted on the surface of the metal block that is opposite to the surface facing the die pad and that is exposed through the opening, and a height difference between the surface of the metal block on which the semiconductor element is mounted and a metal wire connection surface in the printed circuit board in which the metal wire connected to the semiconductor element is connected is $½$ or less of a height of the printed circuit board.

4. The semiconductor device according to claim 1, wherein the printed circuit board is a multilayer substrate in which a plurality of basic substrates each with the wiring pattern being formed are stacked;

the opening is such that an opening area of a lowermost basic substrate being one of the basic substrates on a side closer to a mounting surface on which the semiconductor element is mounted is formed to be smaller than an opening area of an uppermost basic substrate being one of the basic substrates farthest from the semiconductor element; and the semiconductor element is connected to the wiring pattern formed on a surface opposite to a surface facing the die pad in one of the basic substrates except for the uppermost basic substrate by the metal wire.

5. The semiconductor device according to claim 4, wherein, in the printed circuit board, the opening is covered with a lid on the uppermost basic substrate, and the semiconductor element is disposed in a hollow part formed by the die pad, the lid, and the opening.

6. The semiconductor device according to claim 1, wherein a basic material of the printed circuit board is a ceramic base material.

7. The semiconductor device according to claim 1, wherein a basic material of the printed circuit board is a resin base material.

8. The semiconductor device according to claim 2, wherein the semiconductor element is mounted on the surface of the metal block that is opposite to the surface facing the die pad and that is exposed through the opening, and a height difference between the surface of the metal block on which the semiconductor element is mounted and a metal wire connection surface in the printed circuit board in which the metal wire connected to the semiconductor element is connected is $½$ or less of a height of the printed circuit board.

9. The semiconductor device according to claim 2, wherein the printed circuit board is a multilayer substrate in which a plurality of basic substrates each with the wiring pattern being formed are stacked;

the opening is such that an opening area of a lowermost basic substrate being one of the basic substrates on a side closer to a mounting surface on which the semiconductor element is mounted is formed to be smaller than an opening area of an uppermost basic substrate being one of the basic substrates farthest from the semiconductor element; and the semiconductor element is connected to the wiring pattern formed on a surface opposite to a surface facing the die pad in one of the basic substrates except for the uppermost basic substrate by the metal wire.

10. The semiconductor device according to claim 2, wherein a basic material of the printed circuit board is a ceramic base material.

11. The semiconductor device according to claim 3, wherein a basic material of the printed circuit board is a ceramic base material.

12. The semiconductor device according to claim 4, wherein a basic material of the printed circuit board is a ceramic base material.

13. The semiconductor device according to claim 5, wherein a basic material of the printed circuit board is a ceramic base material.

14. The semiconductor device according to claim 2, wherein a basic material of the printed circuit board is a resin base material.

15. The semiconductor device according to claim 3, wherein a basic material of the printed circuit board is a resin base material.

16. The semiconductor device according to claim 4, wherein a basic material of the printed circuit board is a resin base material.

17. The semiconductor device according to claim 5, wherein a basic material of the printed circuit board is a resin base material.

* * * * *